US011014686B2

(12) United States Patent
Trawick et al.

(10) Patent No.: US 11,014,686 B2
(45) Date of Patent: May 25, 2021

(54) DYNAMIC POWER DEMAND ALLOCATION ON REDUNDANT POWER BUSES

(71) Applicant: Rolls-Royce North American Technologies Inc., Indianapolis, IN (US)

(72) Inventors: David R. Trawick, Indianapolis, IN (US); David Loder, Carmel, IN (US)

(73) Assignee: ROLLS-ROYCE NORTH AMERICAN TECHNOLOGIES INC., Indianapolis, IN (US)

( * ) Notice: Subject to any disclaimer, the term of this patent is extended or adjusted under 35 U.S.C. 154(b) by 178 days.

(21) Appl. No.: 16/167,917

(22) Filed: Oct. 23, 2018

(65) Prior Publication Data

US 2020/0122853 A1 Apr. 23, 2020

(51) Int. Cl.
| | |
|---|---|
| *B64D 41/00* | (2006.01) |
| *H03K 17/16* | (2006.01) |
| *H02J 3/00* | (2006.01) |
| *H02J 1/14* | (2006.01) |
| *H02J 3/38* | (2006.01) |
| *H02J 1/08* | (2006.01) |

(52) U.S. Cl.
CPC ............. *B64D 41/00* (2013.01); *H02J 1/08* (2013.01); *H02J 1/14* (2013.01); *H02J 3/00* (2013.01); *H02J 3/381* (2013.01); *H03K 17/16* (2013.01); *B64D 2221/00* (2013.01); *H02J 2310/44* (2020.01)

(58) Field of Classification Search
CPC .. H02J 2310/44; H02J 1/08; H02J 1/14; H02J 4/00; H02J 3/381; H02J 3/00; H03K 17/16; B64D 2221/00; B64D 41/00

USPC ............ 307/10.1, 9.1, 18, 11, 23, 37, 85, 86
See application file for complete search history.

(56) References Cited

U.S. PATENT DOCUMENTS

| 10,673,229 B2* | 6/2020 | Yoscovich ............. H02S 50/00 |
| 2016/0094030 A1 | 3/2016 | Gao et al. |
| 2017/0264258 A1 | 9/2017 | Song et al. |

OTHER PUBLICATIONS

Armstrong, Michael et al., Sensitivity of TEDP Microgrid Systems Weight and Efficiency to Operating Voltage, AIAA Propulsion and Energy Forum, Jul. 28-30, 2014, Cleveland, Ohio, 50th AIAA/ASME/SAE/ASEE Joint Propulsion Conference, (AIAA 2014-3492), American Institute of Aeronautics and Astronautics, 13 pages.

(Continued)

*Primary Examiner* — Arnold M Kinkead
(74) *Attorney, Agent, or Firm* — Brinks Gilson & Lione

(57) ABSTRACT

A redundant, load-sharing system and method for distributing electrical power to components in a vehicle. The system including a source of power, multiple power distribution buses, a plurality of switching devices and at least two channel controllers. The system being configured to isolate the components and power sources that are determined to be electrically noisy from the components and the power sources that are sensitive to electric noise. Each of the components may be assigned a priority based on the criticality of the component to the operation of the vehicle. In the event of at least a partial loss of power in one or more of the power distribution buses, the switching devices disconnect the components from the effected power distribution buses in reverse order of the assigned priority.

17 Claims, 5 Drawing Sheets

(56) References Cited

OTHER PUBLICATIONS

Chakraborty, Imon et al., Electric Control Surface Actuator Design Optimization and Allocation for the More Electric Aircraft, AIAA Aviation Forum, Aug. 12-14, 2013, Los Angeles, CA, 2013 Aviation Technology, Integration, and Operations Conference, (AIAA 2013-4283), American Institute of Aeronautics and Astronautics, 17 pages.

Campbell, Angela, Architecting Aircraft Power Distribution Systems Via Redundancy Allocation, Ph.D. Thesis, Georgia Institute of Technology, School of Aerospace Engineering, Dec. 2014, 352 pages.

Extended European Search Report, issued in European Application No. 19200331.7, dated Feb. 3, 2020, pp. 1-7, European Patent Office, Munich, Germany.

* cited by examiner

DYNAMIC POWER DEMAND ALLOCATION ON REDUNDANT POWER BUSES

TECHNICAL FIELD

This disclosure relates generally to load-sharing systems used to distribute electrical power to various components. More specifically, this disclosure relates to dynamic power demand allocation on redundant power buses.

BACKGROUND

The statements in this section merely provide background information related to the present disclosure and may not constitute prior art.

Aircrafts currently incorporate redundant systems for use in control applications and for propulsive power distribution. For example, redundant hydraulic systems are common practice in the design and construction of large aircraft. The use of these redundant systems contribute to the rarity of complete loss encountered due to the occurrence of control incidents, such as that encountered during the crash-landing of United Airlines 232 in 1989.

Due to the dramatic increase in the number of critical electrical components used aboard an aircraft, power system reliability has become a major concern. Conventionally, power system reliability has been maintained through the use of emergency back-up power sources (e.g., batteries, etc.). However, the power requirements associated with the increasing number of critical electrical components incorporated into an aircraft has quickly surpassed the capacity of these emergency devices.

Reliability may be defined as the probability of a device performing its purpose adequately for the period of time intended under the operating conditions encountered. Power system reliability is a function of reliability and redundancy associated with each component in the system. The reliability of individual components is determined only after completing the detailed design of the component. On the other hand, the amount of redundancy incorporated into a system is established during the design of the system's architecture. Therefore, power system reliability has to be addressed in the design of the primary power distribution system.

DRAWINGS

In order that the disclosure may be well understood, there will now be described various forms thereof, given by way of example, reference being made to the accompanying drawings, in which.

Figure 1:
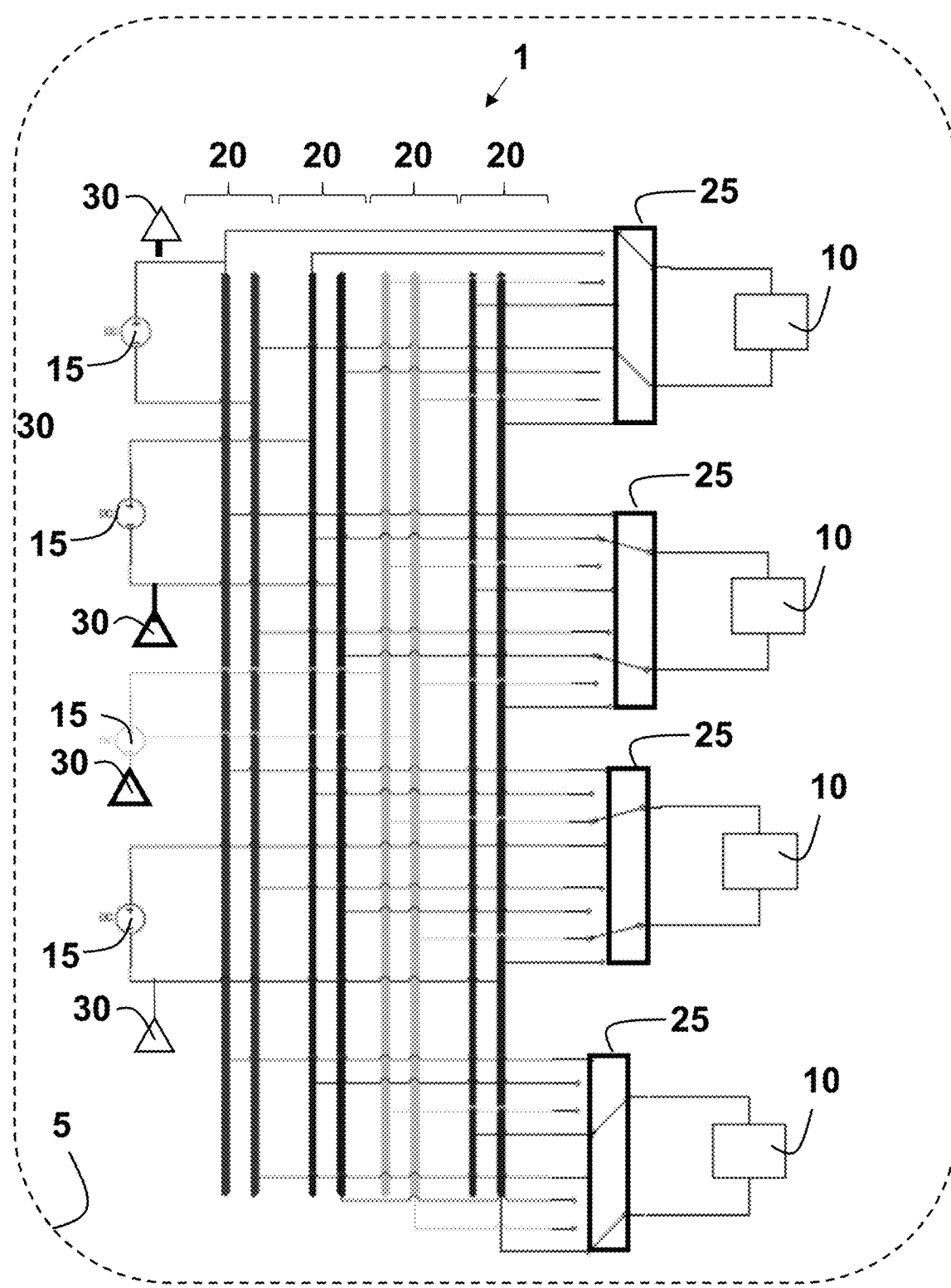
FIG. 1 is a schematic representation of a system constructed according to the teachings of the present disclosure that comprises multiple power buses and loads along with power source selection capability.

The drawings described herein are for illustration purposes only and are not intended to limit the scope of the present disclosure in any way.

DETAILED DESCRIPTION

The present disclosure generally provides a load-sharing system used to distribute electrical power to various components. This system uses switching devices to electrically couple or connect each component to multiple power distribution buses depending on the position of the switching device. In the event of a partial loss of power capacity to a power distribution bus, the switching devices disable electric loads in reverse order to their priority to the flight of the aircraft. For example, during a flight of an aircraft the switching devices would disconnect cabin entertainment devices before turning off flight instruments and radios. However, if the buses are operable, the components are divided between them depending on the noise being generated or expected to be generated by each component and each power source, and the noise tolerated and expected to be tolerated by each component and each power source.

The following description is merely exemplary in nature and is in no way intended to limit the present disclosure or its application or uses. For example, the redundant load-sharing system made and used according to the teachings contained herein is described throughout the present disclosure in conjunction with distributing electrical power to various components in an aircraft in order to more fully illustrate the functionality of the system and the use thereof. The incorporation and use of such a redundant load-sharing system in other applications that include components that are electrically coupled to multiple power distribution buses are contemplated to be within the scope of the present disclosure. Several examples of such applications includes, without limitation, automobiles, trucks, tractors, heavy machinery, boats, ships, trains, satellites, spaceships, or the like. The terms "vehicle" or "vehicles" as used herein is intended to incorporate each of these possible applications and to be synergistic therewith.

According to one aspect of the present disclosure, multiple power buses are incorporated into the design of a power distribution system in order to preserve system functionality if any of the power buses exhibits signs of failure. System functionality is maintained through redundant components providing substantially the same functions powered by being coupled to different power distribution buses, or by having the components or subsystems of the components capable of drawing power from multiple buses. The redundancy of the components across the different power distribution buses can result in relatively uniform use of each of the buses. The different components electrically coupled to the system produce different amounts of electric noise on the power buses to which the components are coupled. In addition, each of the different components may exhibit a different tolerance to electric noise. In other words, although the components producing noise may be relatively tolerant to noise, other components may only be able to operate at a reduced level of performance or for a reduced service life when subjected to electronic noise.

For the purpose of this disclosure, the term "power distribution buses" is intended to describe any combination of power transmission cables, busbars, and fault protection devices used to electrically couple or connect one or more sources of power to multiple components, loads, or sinks. When used herein, the terms of components, loads, or sinks are meant to refer to similar or the same elements. The power transmission cables used in the construction of the power distribution buses may comprise a metal, including without limitation copper, aluminum, or an alloy thereof. When desirable, the cables may be a coaxial cable. Such coaxial cables comprise a supply and return conductor, an inner shielding layer to protect the cable from electric and magnetic fields, and an outer jacket to protect the cable from containments from the environment.

For the purpose of this disclosure the terms "about" and "substantially" are used herein with respect to measurable values and ranges due to expected variations known to those skilled in the art (e.g., limitations and variability in measurements).

Redundancy is an important engineering tool used to design, implement, and prove reliability for many complex, safety-critical technologies. As used herein, an element may considered as being redundant in a system if the system contains another means, e.g., a backup, for performing the same functionality or work if the element fails to function. Similarly, a system is redundant, when the system comprises redundant elements. One skilled in the art will understand that redundancy may mean (1) having several elements that can work together simultaneously but are capable of performing the work or function individually when necessary, such as the engines used in large aircrafts, or (2) having idle elements that awaken when the system needs them, such as the incorporation of back-up generators.

The electrical noise created on each of the power distribution buses attributed to the different components and power sources that are electrically coupled or connected to the buses may be determined according to several different means or methods. One method is estimating the level of noise that will be generated based on measurement results obtained from prior testing of the components and power sources or information and data obtained from the supplier or manufacturer of the components and power sources. A second method is to measure the noise generated by the components and power sources in-situ during the operation of the vehicle, e.g., during the flight of the aircraft.

The in-situ measurement of noise may be accomplished by various means, including but not limited to, connecting one or more voltage sensors configured to measure the electrical noise generated by one or more of the components and power sources to at least one of the power distribution buses. The voltage sensors should have sufficient fidelity to measure the noise on each bus, and by moving components back and forth be used to determine which components are contributing to the measured noise. Another means for such in-situ noise measurement is to measure the noise in the electrical current present after each component or load. When desirable, this type of noise measurement may be accomplished within the switching devices.

For purposes of promoting an understanding of the principles of the present disclosure, reference will now be made to the embodiments illustrated in the drawings, and specific language will be used to describe the same. It should be understood that throughout the description, corresponding reference numerals indicate like or corresponding parts and features. One skilled in the art will further understand that any properties reported herein represent properties that are routinely measured and may be obtained by multiple different methods. The methods described herein represent one such method and other methods may be utilized without exceeding the scope of the present disclosure.

No limitation of the scope of the present disclosure is intended by the illustration and description of certain embodiments herein. In addition, any alterations and/or modifications of the illustrated and/or described embodiment(s) are contemplated as being within the scope of the present disclosure. Further, any other applications of the principles of the present disclosure, as illustrated and/or described herein, as would normally occur to one skilled in the art to which the disclosure pertains, are contemplated as being within the scope thereof.

Referring to FIG. 1, a redundant, load-sharing system 1 that is configured to distribute electrical power to components 10 in a vehicle 5, such as an aircraft is provided. This system 1 comprises a plurality of power sources 15, at least two power distribution buses 20, a plurality of switching devices 25, and at least two channel controllers 30. Each of the power distribution buses 20 is electrically coupled to one or more of the power sources 15. Each of the switching devices 25 is configured to electrically couple and/or decouple one or more of the components 10 to at least one of the power distribution buses 20. Each of the channel controllers 30 is configured to receive power from at least one of the power distribution buses 20 and provide power allocation instructions to one or more of the switching devices 25. The switching devices 25 isolate the components 10 and the power sources 15 that are determined to be electrically noisy from the components 10 and the power sources 15 that are sensitive to electric noise.

The load-sharing system 1 is shown is shown in FIG. 1 with four different power distribution buses 20 with four loads or components 10 capable of switching between any of the buses 20. One skilled in the art will understand that a system 1 may include more than four loads or components 10 without exceeding the scope of the present disclosure. The components 10 are connected to the power distribution buses 20 such that the amount of electrical noise generated or expected to be generated by the sum of the components 10 and power sources 15 connected to each of the power distribution buses 20 is less than the amount of electrical noise tolerated or expected to be tolerated by each of the components 10 or power sources 15.

For the purpose of this disclosure, the terms "at least one" and "one or more of" an element are used interchangeably and may have the same meaning. These terms, which refer to the inclusion of a single element or a plurality of the elements, may also be represented by the suffix "(s)" at the end of the element. For example, "at least one power source", "one or more power sources", and "power source (s)" may be used interchangeably and are intended to have the same meaning.

The power source may be any means of providing power known to one skilled in the art, including without limitation, batteries, generators, or alternators driven by an engine or powered by an auxiliary power unit (APU). The power generated may be used without modification or it may be routed through a transformer, a power converter, an inverter, or a rectifier.

The switching devices used in the load-sharing system 1 may be selected to provide protection from overcurrent and overvoltage. These switching devices may include, without limitation, a high-powered contactor, a semi-conductor power switch, an electronic control switch, a rotary switch, a toggle switch, or a biased switch, to name a few.

The channel controller may include any means of control known to one skilled in the art that performs logic operations. The controller may be in communication with a memory (not shown). Alternatively or in addition, the controller may be in communication with multiple components within the load-sharing system. The controller may include a general processor, a central processing unit, a server device, an application specific integrated circuit (ASIC), a digital signal processor, a field programmable gate array (FPGA), a digital circuit, an analog circuit, a microcontroller, any other type of processor, or any combination thereof. The controller may include one or more elements operable to execute computer executable instructions or computer code embodied in the memory.

The memory may be any device for storing and retrieving data or any combination thereof. The memory may include non-volatile and/or volatile memory, such as a random access memory (RAM), a read-only memory (ROM), an erasable programmable read-only memory (EPROM), or flash memory. Alternatively or in addition, the memory may include an optical, magnetic (hard-drive) or any other form of data storage device.

Still referring to FIG. 1, the redundant, load-sharing system 1 is configured so that most if not all of the loads or components 10 in the system may be connected to multiple power distribution buses 20. In other words, one or more of the components 10 is configured so that the components 10 can draw power from more than one of the power distribution buses 20 depending upon the position of the switching device 15.

One or more of the components 10 electrically coupled to one of the power distribution buses 20 may be considered to be active components 10 for which one or more redundant components 10 coupled to a different one of the power distribution buses 20 provide the same functionality as the active components 10. The redundancy of the components 10 connected to different power distribution buses 20 provides for more uniform use of each of the power distribution buses 20.

In addition to selecting the power distribution bus 20 for each load or component 10 so that electrically noisy sources 15 and loads 10 may be isolated from electric noise sensitive sources 15 and loads 10, the power distribution buses 20 are also configured so that the bus 20 to which the component 10 is coupled may be changed as required to maintain system 1 functionality in case of a partial fault or total failure of a bus 20 or a power source 15. In the event of at least a partial loss of power in one or more of the power distribution buses 20, the switching devices 25 disconnect the components 10 from the effected power distribution buses 20 in reverse order of the assigned priority. Each of the components 10 is assigned a priority based on the criticality of the component 10 to the operation of the vehicle 5, e.g., the flight of the aircraft.

Figure 2:
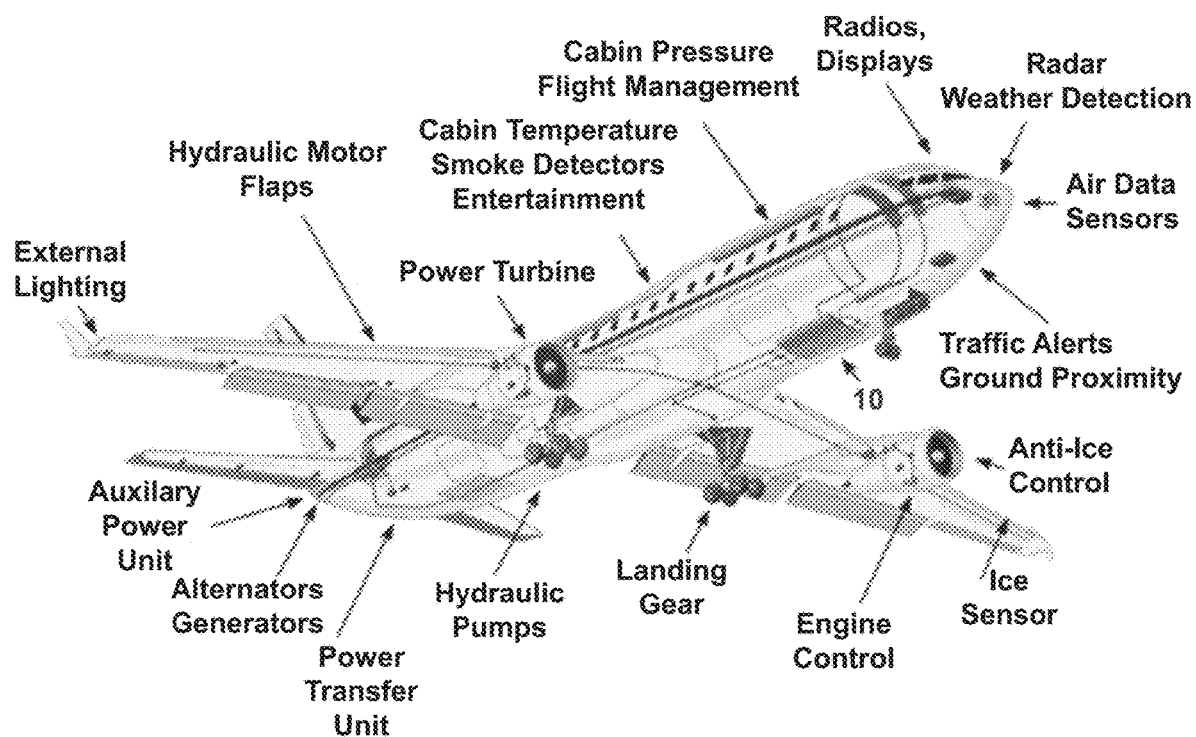
FIG. 2 is a schematic representation of an aircraft highlighting some of the critical and noncritical components or loads associated with an aircraft.

Each of the loads or components 10 in a vehicle 5 may be classified as being either critical or non-critical to the operation of the vehicle 5. A critical component represents a component 10 whose 'failure' could threaten the successful or continued operation of the vehicle, thereby, endangering human life or the environment in which the vehicle operates. Referring now to FIG. 2, various critical and non-critical loads or components 10 present in an aircraft are identified. The critical components or loads may include, without limitation, engine control, landing gear, hydraulic pumps, flight radios and displays, cabin pressure control, power turbines, and flaps, among others. Non-critical components or loads may include, but not be limited to, smoke detectors and entertainment devices, to name a few.

Figure 3:
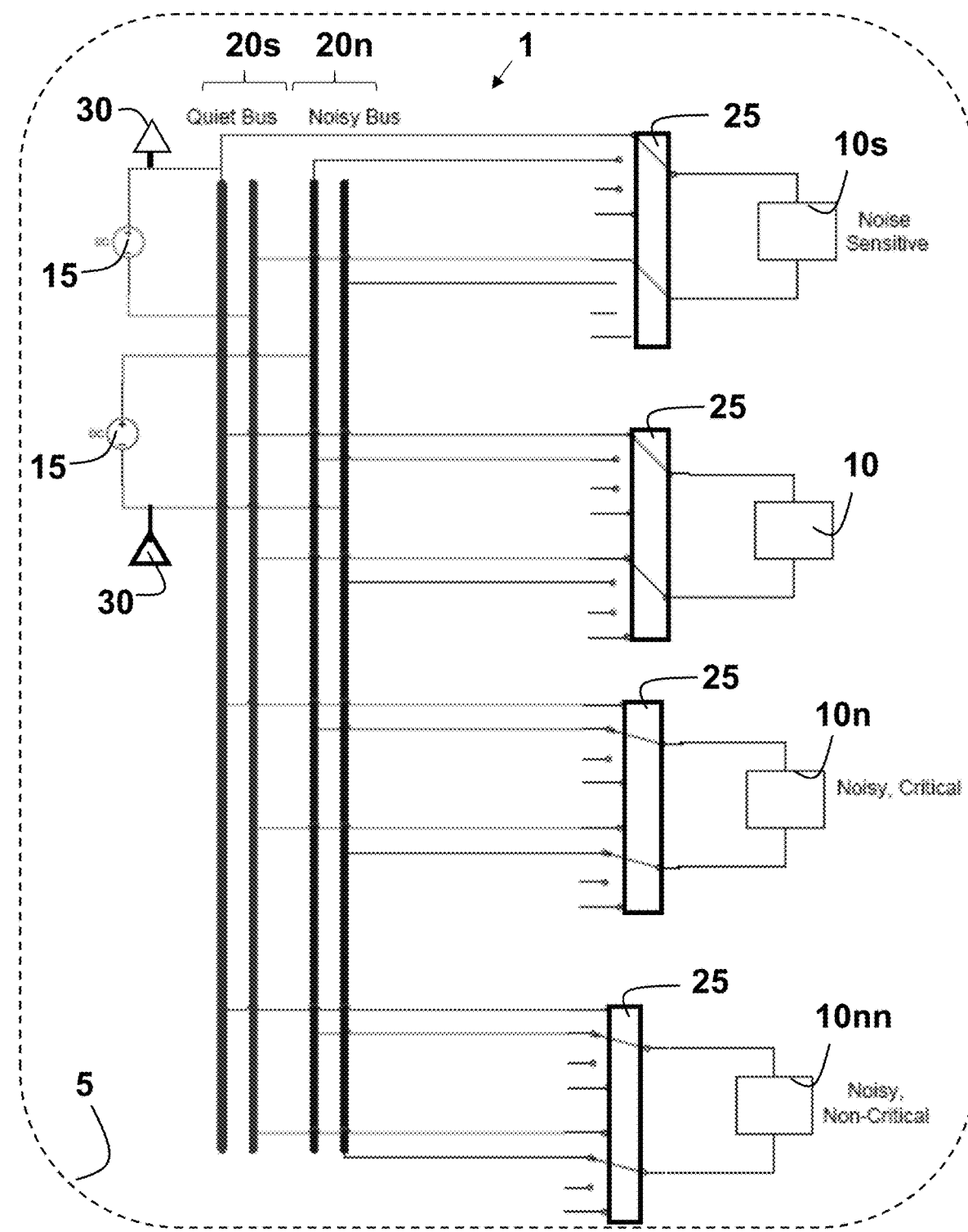
FIG. 3 is a schematic representation of a subset of the system shown in FIG. 1 with noisy loads isolated from noise sensitive loads according to the teachings of the present disclosure.

Referring now to FIG. 3, a subset of the load-sharing system 1 of FIG. 1 is provided to demonstrate the isolation of loads or components 10 that exhibit electrical noise from loads or components 10 that are sensitive to such electrical noise. More specifically, in FIG. 3 the loads or components 10n, 10nn that generate such electrical noise are isolated from the noise-sensitive loads components 10s by the switching devices 25 connecting or coupling the noisy components 10n, 10nn to one power distribution power bus 20n and the noise-sensitive component 10s to another power distribution bus 20s. In this scenario, some of the noisy loads 10nn may be as critical as the noise-sensitive loads 10s to the operation of the vehicle. Thus, FIG. 3 demonstrates a load-sharing system 1 that includes both a noisy power distribution bus 20n and a quiet power bus 20s in operation.

A load or component 10s that is sensitive to noise may be defined as a load or component 10s whose performance or lifetime is diminished due to the presence of electrical noise. Alternatively, a noise-sensitive component 10s may experience a reduction in performance or lifetime of at least 5%; alternatively, at least 10%; alternatively, at 25%; alternatively, 33% or more; alternatively 40% or more.

Figure 4:
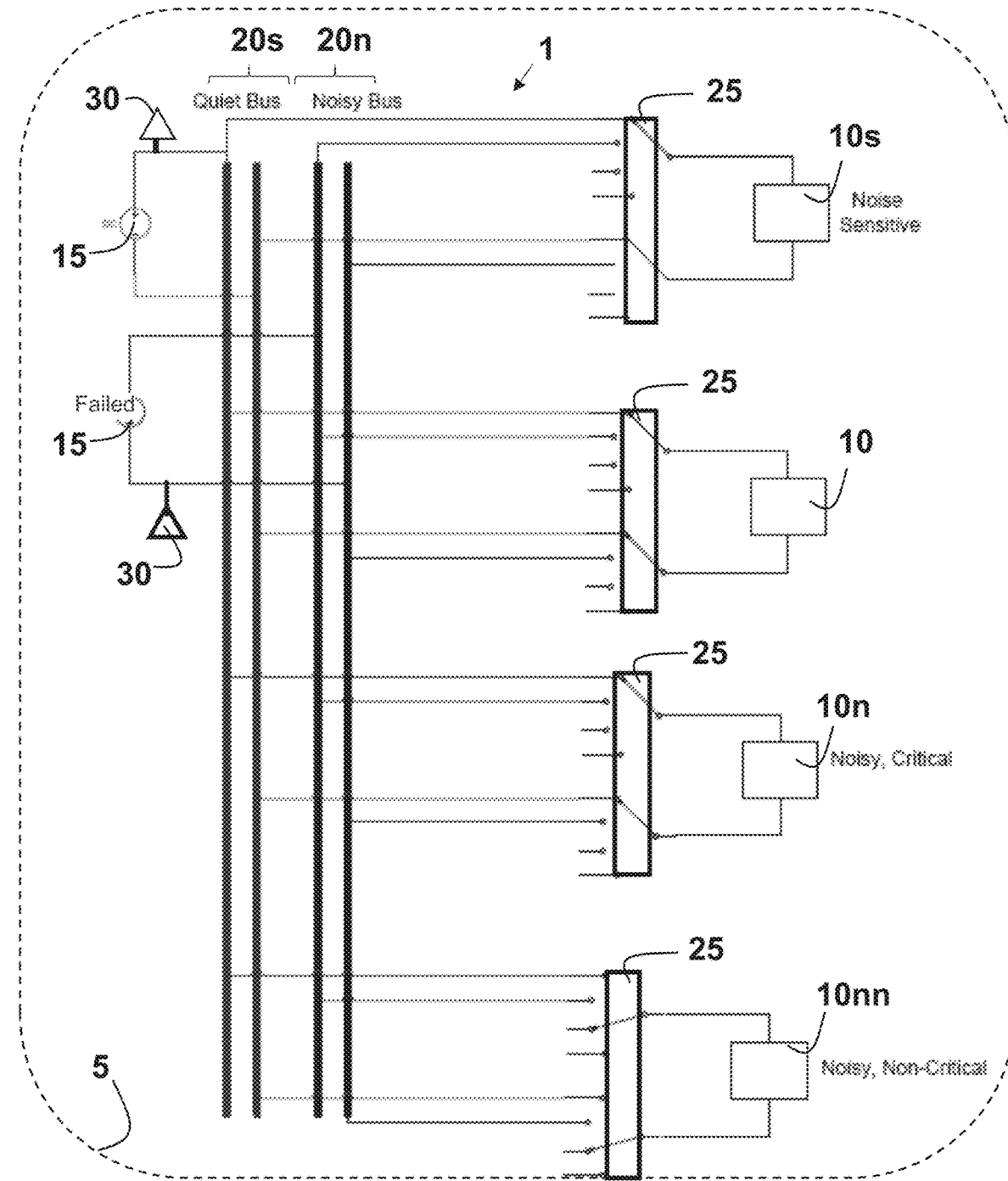
FIG. 4 is another schematic representation of a system reconfigured according to the teachings of the present disclosure after a power source to a noisy bus has failed.

Referring now to FIG. 4, the subset of the load-sharing system 1 of FIG. 3 is shown in which the noisy power distribution bus 20n has failed. In this scenario, the channel controllers 30 have instructed the switching devices 25 to switch the noisy component 10nn, which has been assigned a high priority because it is a critical to the operation of the vehicle 5, to the other power distribution bus 10s. In other words, the noisy non-critical load 10n is shut off and the noisy critical load 10nn is connected to the power distribution bus 20s that is still operational.

Figure 5:
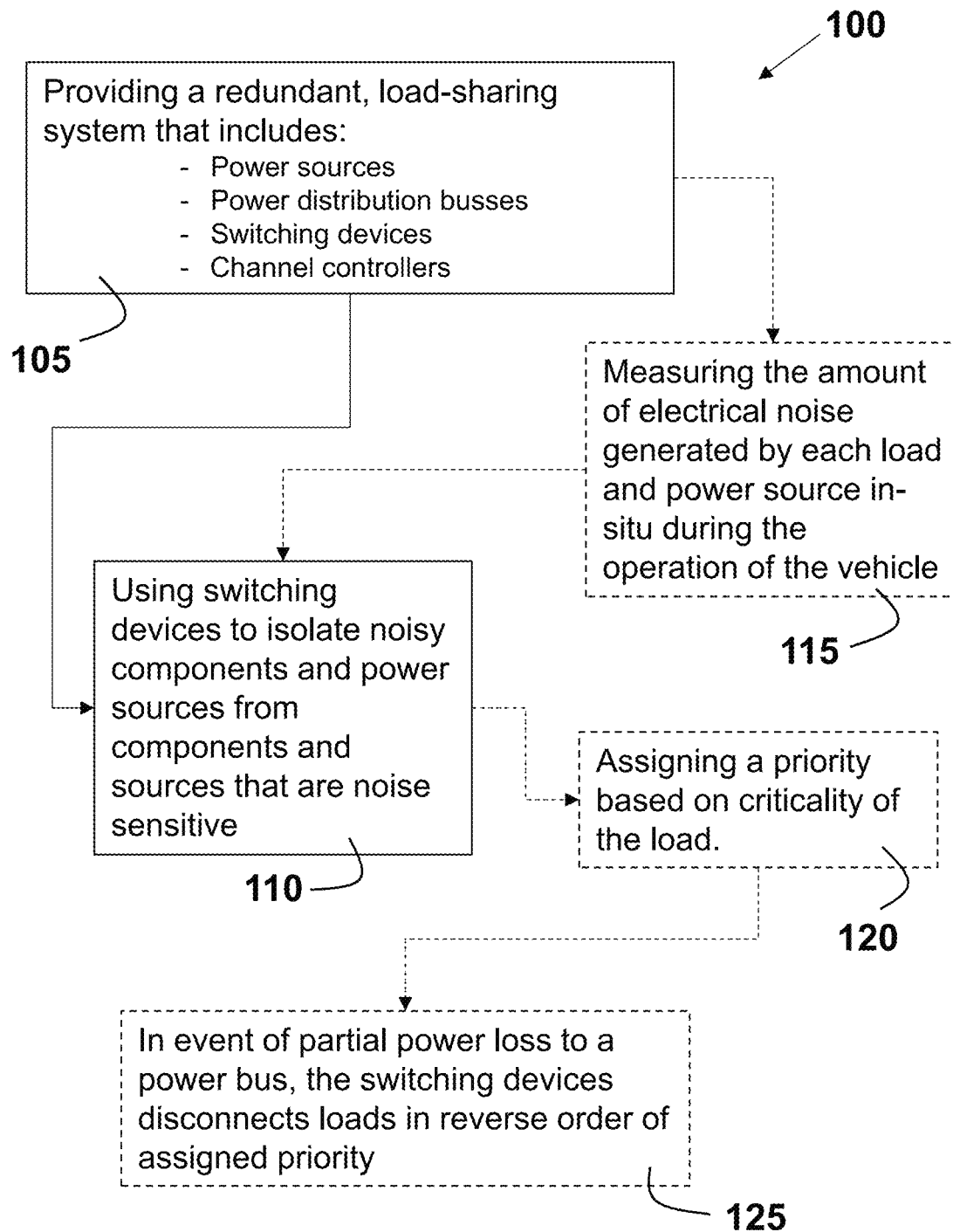
FIG. 5 is a flowchart of a method for distributing electrical power to various components of an aircraft while the aircraft is in flight.

According to another aspect of the present disclosure, a method of distributing power to components of a vehicle. Referring now to FIG. 5, this method 100 generally comprises providing 105 a redundant, load-sharing system as previously described above and further defined herein and using 110 the switching devices incorporated into the load sharing system to isolate electrically noisy components and power sources from components and sources that are sensitive to such electrical noise. When desirable, the amount of electrical noise generated by each load and power source may be measured 115 in-situ during the operation of the vehicle.

The method 100 may further comprise assigning 120 a priority to each of the components based on the criticality of the component to the operation of the vehicle, e.g., the flight of the aircraft. In the event of at least a partial loss of power in one or more of the power distribution buses, the switching devices disconnect 125 the components from the effected power distribution buses in reverse order of the assigned priority.

Within this specification, embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

The subject-matter of the disclosure may also relate, among others, to the following Aspects:

1. A redundant, load-sharing system to distribute electrical power to vehicle components, the system comprising:
    a plurality of power sources:
    at least two power distribution buses, wherein each of the power distribution buses is electrically coupled to one or more of the power sources;
    a plurality of switching devices, wherein each of the switching devices is configured to electrically couple and/or decouple one or more of the vehicle components to at least one of the power distribution buses; and at least two channel controllers, wherein each of the channel controllers is configured to receive power from at least one of the power distribution buses and provide power allocation instructions to one or more of the switching devices;

wherein the switching devices isolate the components and the power sources that are determined to be electrically noisy from the components and the power sources that are sensitive to electric noise.

2. The system according to Aspect 1, wherein one or more of the components electrically coupled to one of the power distribution buses are active components for which one or more redundant components coupled to a different one of the power distribution buses provide the same functionality as the active components.

3. The system according to Aspect 2, wherein the redundancy of the components connected to different power distribution buses provides for uniform use of each of the power distribution buses.

4. The system according to any of Aspects 1-3, wherein at least one of the components is configured to draw power from more than one of the power distribution buses.

5. The system according to any of Aspects 1-4, wherein each of the components is assigned a priority based on the criticality of the component to the operation of the vehicle.

6. The system according to Aspect 5, wherein in the event of at least a partial loss of power in one or more of the power distribution buses, the switching devices disconnect the components from the effected power distribution buses in reverse order of the assigned priority.

7. The system according to any of Aspect 1-6, wherein the amount of electric noise generated by each of the components and power sources is either measured in-situ during the operation of the vehicle or supplied as existing information provided by the supplier or measured prior to the operation of the vehicle.

8. The system according to Aspect 7, wherein at least one of the power distribution buses includes one or more voltage sensors configured to measure the electrical noise generated by one or more of the components and power sources connected to the at least one power distribution bus.

9. The system according to Aspect 7, wherein the electrical noise is determined from the electrical current present after each of the components and power sources.

10. The system according to any of Aspects 1-9, wherein the components are connected to the power distribution buses such that the amount of electrical noise generated or expected to be generated by the sum of the components and power sources connected to each of the power distribution buses is less than the amount of electrical noise tolerated or expected to be tolerated by each of the components or power sources.

11. A method of distributing electrical power to various components of a vehicle, the method comprising:
providing a redundant, load-sharing system comprising:
a plurality of power sources:
at least two power distribution buses, wherein each of the power distribution buses is electrically coupled to one or more of the power sources;
a plurality of switching devices, wherein each of the switching devices is configured to electrically couple and/or decouple one or more of the vehicle components to at least one of the power distribution buses; and
at least two channel controllers, wherein each of the channel controllers is configured to receive power from at least one of the power distribution buses and provide power allocation instructions to one or more of the switching devices; and using the switching devices to isolate the components and the power sources that are determined to be electrically noisy from the components and the power sources that are sensitive to electric noise;

wherein one or more of the components electrically coupled to one of the power distribution buses are active components for which one or more redundant components coupled to a different one of the power distribution buses provide the same functionality as the active components.

12. The method according to Aspect 11, wherein the method further comprises assigning a priority to each of the components based on the criticality of the component to the operation of the vehicle;

wherein in the event of at least a partial loss of power in one or more of the power distribution buses, the switching devices disconnect the components from the effected power distribution buses in reverse order of the assigned priority.

13. The method according to any of Aspects 11 or 12, wherein the method further comprises measuring the amount of electric noise generated by each of the components and power sources in-situ during the operation of the vehicle.

14. The method according to Aspect 13, wherein the amount of electrical noise generated by each of the components and power sources is measured using one or more voltage sensors coupled to at least one of the power distribution buses.

15. The method according to any of Aspects 11-14, wherein the method further comprises connecting the components to the power distribution buses such that the amount of electrical noise generated or expected to be generated by the sum of the components and power sources connected to each of the power distribution buses is less than the amount of electrical noise tolerated or expected to be tolerated by each of the components or power sources.

16. A redundant, load-sharing system configured to distribute electrical power to vehicle components according to any of the methods of Aspects 11-15.

17. A load-sharing system for distributing electrical power to vehicle components, the system comprising:
two or more power distribution buses, wherein each of the power distribution buses are electrically coupled to at least one means of power;
a plurality of switching devices, wherein each of the switching devices is in communication with a controller that is configured to instruct the switching devices to electrically couple and/or decouple one or more of the vehicle components from at least one of the power distribution buses;
wherein the switching devices isolate the components that are determined to be electrically noisy from the components that are sensitive to electric noise.

18. The system according to Aspect 17, wherein one or more of the components electrically coupled to one of the power distribution buses are active components for which one or more redundant components coupled to a different one of the power distribution buses provide the same functionality as the active components.

19. The system according to any of Aspects 17 or 18, wherein at least one of the components is configured to draw power from more than one of the power distribution buses.

20. The system according to any of Aspects 17-19, wherein each of the components is assigned a priority based on the criticality of the component to the operation of the vehicle;
  wherein in the event of a at least a partial loss of power in one or more of the power distribution buses, the switching devices disconnect the components from the effected power distribution buses in reverse order of their assigned priority.

The foregoing description of various forms of the invention has been presented for purposes of illustration and description. It is not intended to be exhaustive or to limit the invention to the precise forms disclosed. Numerous modifications or variations are possible in light of the above teachings. The forms discussed were chosen and described to provide the best illustration of the principles of the invention and its practical application to thereby enable one of ordinary skill in the art to utilize the invention in various forms and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A redundant, load-sharing system to distribute electrical power to a plurality of components in a vehicle, the system comprising:
  at least two power distribution buses;
  a plurality of components electrically coupled to the at least two power distribution buses;
  a plurality of power sources electrically coupled to the at least two power distribution buses;
  a plurality of switching devices, wherein each of the switching devices is configured to electrically couple and/or decouple one or more of the plurality of components to at least one of the power distribution buses; and
  at least two channel controllers, wherein each of the channel controllers is configured to receive power from at least one of the power distribution buses and provide power allocation instructions to one or more of the plurality of switching devices;
  wherein the plurality of switching devices isolate the plurality of components and the power sources that are determined to be electrically noisy from the plurality of components and the power sources that are sensitive to electric noise, and
  wherein an amount of electric noise generated by each of the plurality of components and power sources is either measured in-situ during operation of the vehicle or supplied as existing information provided by a supplier or measured prior to the operation of the vehicle.

2. The system according to claim 1, wherein the plurality of components include one or more active components and one or more redundant components providing the same functionality as the one or more active components.

3. The system according to claim 1, wherein at least one of the plurality of components is configured to draw power from more than one of the power distribution buses.

4. The system according to claim 1, wherein each of the plurality of components is assigned a priority based on the criticality of the plurality of components to the operation of the vehicle.

5. The system according to claim 4, wherein in the event of at least a partial loss of power in one or more of the power distribution buses, the plurality of switching devices disconnect the plurality of components from the effected power distribution buses in reverse order of the assigned priority.

6. The system according to claim 1, wherein at least one of the power distribution buses includes one or more voltage sensors configured to measure the electrical noise generated by one or more of the plurality of components and power sources connected to the at least one power distribution bus.

7. The system according to claim 1, wherein the electrical noise is determined from the electrical current present after each of the components and power sources.

8. The system according to claim 1, wherein the plurality of components are connected to the power distribution buses such that the amount of electrical noise generated or expected to be generated by the sum of the plurality of components and power sources connected to each of the power distribution buses is less than the amount of electrical noise tolerated or expected to be tolerated by each of the plurality of components or power sources.

9. A method of distributing electrical power to a plurality of components of a vehicle, the method comprising:
  providing a redundant, load-sharing system comprising:
    at least two power distribution buses, wherein each of the power distribution buses is electrically coupled to one or more of the power sources;
    a plurality of components electrically coupled to the at least two power distribution buses;
    a plurality of power sources electrically coupled to the at least two power distribution buses;
    a plurality of switching devices, wherein each of the switching devices is configured to electrically couple and/or decouple one or more of the components to at least one of the power distribution buses; and
    at least two channel controllers, wherein each of the channel controllers is configured to receive power from at least one of the power distribution buses and provide power allocation instructions to one or more of the plurality of switching devices; and
  using the plurality of switching devices to isolate the plurality of components and the power sources that are determined to be electrically noisy from the plurality of components and the power sources that are sensitive to electric noise;
  wherein the plurality of components include one or more active components and one or more redundant components providing the same functionality as the one or more active components.

10. The method according to claim 9, wherein the method further comprises assigning a priority to each of the plurality of components based on the criticality of the component to the operation of the vehicle;
  wherein, in the event of at least a partial loss of power in one or more of the power distribution buses, the plurality of switching devices disconnect the respective one or more of the plurality of components in reverse order of the assigned priority.

11. The method according to claim 9, wherein the method further comprises measuring the amount of electric noise generated by each of the the plurality of components and power sources in-situ during the operation of the vehicle.

12. The method according to claim 11, wherein the amount of electrical noise generated by each of the plurality of components and power sources is measured using one or more voltage sensors coupled to at least one of the power distribution buses.

13. The method according to claim 9, wherein the method further comprises connecting the plurality of components to the power distribution buses such that the amount of electrical noise generated or expected to be generated by the sum of the plurality of components and power sources connected to each of the power distribution buses is less than the amount of electrical noise tolerated or expected to be tolerated by each of the plurality of components or power sources.

14. A redundant, load-sharing system configured to distribute electrical power to the plurality of components of the vehicle according to the method of claim 9.

15. A load-sharing system for distributing electrical power to a plurality of components, the system comprising:
- two or more power distribution buses, wherein each of the power distribution buses are electrically coupled to at least one means of power;
- a plurality of components electrically coupled to the two or more power distribution buses wherein at least one of the components is configured to draw power from more than one of the power distribution buses;
- a plurality of switching devices, wherein each of the switching devices is in communication with a controller that is configured to instruct the plurality of switching devices to electrically couple and/or decouple one or more of the plurality of components from at least one of the power distribution buses;
- wherein the plurality of switching devices isolate the plurality of components that are determined to be electrically noisy from the components that are sensitive to electric noise.

16. The system according to claim 15, wherein the plurality of components include one or more active components and one or more redundant components providing the same functionality as the one or more active components.

17. The system according to claim 15, wherein each of the plurality of components is assigned a priority based on the criticality of the component to the operation of the vehicle;
- wherein, in the event of at least a partial loss of power in one or more of the power distribution buses, the plurality of switching devices disconnect the respective one or more of the plurality of components in reverse order of their assigned priority.

* * * * *